United States Patent
Kim et al.

(10) Patent No.: US 7,961,005 B1
(45) Date of Patent: Jun. 14, 2011

(54) NON-VOLATILE LOGIC CIRCUITS, INTEGRATED CIRCUITS INCLUDING THE NON-VOLATILE LOGIC CIRCUITS, AND METHODS OF OPERATING THE INTEGRATED CIRCUITS

(75) Inventors: Ho-jung Kim, Suwon-si (KR); Jae-kwang Shin, Anyang-si (KR); Sun-ae Seo, Hwaseong-si (KR)

(73) Assignee: Samsung Electronics Co., Ltd., Gyeonggi-do (JP)

( * ) Notice: Subject to any disclaimer, the term of this patent is extended or adjusted under 35 U.S.C. 154(b) by 0 days.

(21) Appl. No.: 12/805,550

(22) Filed: Aug. 5, 2010

(30) Foreign Application Priority Data

Dec. 9, 2009 (KR) .................. 10-2009-0121938

(51) Int. Cl.
*G06F 7/38* (2006.01)
*H03K 19/173* (2006.01)

(52) U.S. Cl. ................ 326/46; 326/38; 326/40

(58) Field of Classification Search .............. 326/37–38, 326/40, 46; 365/154, 156, 158, 189.05, 189.19, 365/189.2, 205, 209
See application file for complete search history.

(56) References Cited

U.S. PATENT DOCUMENTS

| 6,269,027 | B1 | 7/2001 | Hurst, Jr. et al. |
| 6,317,359 | B1 | 11/2001 | Black et al. |
| 6,717,844 | B1 | 4/2004 | Ohtani |
| 6,944,050 | B2 | 9/2005 | Kang et al. |
| 6,992,935 | B2 * | 1/2006 | Ooishi ............. 365/189.05 |
| 7,082,053 | B1 * | 7/2006 | Jenne et al. ............. 365/173 |
| 7,206,217 | B2 | 4/2007 | Ohtsuka et al. |
| 7,471,554 | B2 | 12/2008 | Spall et al. |
| 2007/0165446 | A1 | 7/2007 | Oliva et al. |

FOREIGN PATENT DOCUMENTS

| JP | 2003-157671 | 5/2003 |
| JP | 2007-052879 | 3/2007 |
| JP | 2008-085770 | 4/2008 |
| JP | 2008-103044 | 5/2008 |
| WO | WO 2004/040582 | 5/2004 |
| WO | WO 2009/028298 | 3/2009 |
| WO | WO 2009/060625 | 5/2009 |
| WO | WO 2009/070595 | 6/2009 |

* cited by examiner

*Primary Examiner* — Anh Q Tran
(74) *Attorney, Agent, or Firm* — Harness, Dickey & Pierce, P.L.C.

(57) ABSTRACT

Provided is a non-volatile logic circuit that includes a latch unit having a pair of latch nodes and a pair of non-volatile memory cells to be supplied first and second write voltages according to data of the pair of latch nodes when a write enable signal is activated such that a write operation is performed with respect to the pair of non-volatile memory cells. The first and second write voltages are different and logic values of data written to the respective non-volatile memory cells are different.

20 Claims, 12 Drawing Sheets

US 7,961,005 B1

NON-VOLATILE LOGIC CIRCUITS, INTEGRATED CIRCUITS INCLUDING THE NON-VOLATILE LOGIC CIRCUITS, AND METHODS OF OPERATING THE INTEGRATED CIRCUITS

CROSS-REFERENCE TO RELATED APPLICATIONS

This non-provisional U.S. application claims priority under 35 U.S.C. §119 to Korean Patent Application No. 10-2009-0121938, filed on Dec. 9, 2009, in the Korean Intellectual Property Office, the entire contents of which are incorporated herein by reference.

BACKGROUND

1. Field

The present disclosure relates to non-volatile logic circuits, and more particularly, to non-volatile logic circuits including non-volatile memory devices, integrated circuits including the non-volatile logic circuits, and methods of operating the integrated circuits.

2. Description of the Related Art

A need for development of memory devices that have high storage capacity and consumes less power has triggered research into next-generation memory devices that are not only non-volatile memory but also do not need to be refreshed. Recently, much attention has been paid to next-generation memory devices, such as Phase Change Random Access Memory (PRAM), Nano Floating Gate Memory (NFGM), Polymer RAM (PoRAM), Magnetic RAM (MRAM), Ferroelectric RAM (FeRAM), and Resistive RAM (RRAM). Accordingly, research has been actively conducted in order to apply such a next-generation memory device to a logic circuit.

SUMMARY

Provided are non-volatile logic circuits, to which non-volatile memory devices are applied for shorter booting time and writing operations are performed with respect to the non-volatile memory devices for a reduced number of times in consideration of endurances of the non-volatile memory devices, integrated circuits including the non-volatile logic circuits, and methods of operating the integrated circuits.

Additional aspects will be set forth in part in the description which follows and, in part, will be apparent from the description, or may be learned by practice of example embodiments.

According to an example embodiment, a non-volatile logic circuit includes a latch unit having a pair of latch nodes and a pair of non-volatile memory cells configured to receive first and second write voltages based on data of the pair of latch nodes and a write enable signal. The first and second write voltages are different from each other and logic values of data written to the respective non-volatile memory cells are different.

The pair of latch nodes are configured to receive data stored in the pair of non-volatile memory cells based on a read enable signal. Furthermore, the pair of non-volatile memory cells may not be connected to the pair of latch nodes when the write enable signal based on the read enable signal.

The non-volatile logic circuit may further include a normal operation selecting unit configured to control a connection between the pair of non-volatile memory cells and the pair of latch nodes based on a read enable signal and the write enable signal, a read operation selecting unit configured to provide data stored in the pair of non-volatile memory cells to the pair of latch nodes based on the read enable signal, and a write operation selecting unit configured to apply the first and second write voltages to the pair of non-volatile memory cells, respectively, based on data of the pair of latch nodes when the write enable signal is activated.

The non-volatile logic circuit may further include an equalization unit configured to connect the pair of latch nodes based on a pulse signal for equalizing data of the pair of latch nodes.

The normal operation selecting unit may include a logic gate configured to output an activated output signal based on the read enable signal and the write enable signal, and first and second ground switches configured to connect the pair of latch nodes, respectively, to ground voltage terminals based on the activated output signal. The read operation selecting unit may include first and second read switches configured to connect the pair of latch nodes to the pair of non-volatile memory cells, respectively, based on the read enable signal. The write operation selecting unit may include first and second write voltage providing units configured to apply the first and second write voltages, respectively, based on the write enable signal, two first write switches configured to connect the first and second write voltage providing units to the pair of non-volatile memory cells, respectively, based on data of a first latch node of the pair of the latch nodes, and two second write switches configured to connect the first and second write voltage providing units to the pair of non-volatile memory cells, respectively, based on data of a second latch node of the pair of the latch nodes.

According to another example embodiment, a circuit block includes a master latch configured to latch input data and a slave latch configured to latch output data of the master latch. The slave latch includes a latch unit having a pair of latch nodes and a pair of latch nodes and a pair of non-volatile memory cells configured to receive first and second write voltages based on data of the pair of latch nodes and a write enable signal. The first and second write voltages are different from each other and logic values of data written to the respective non-volatile memory cells are different.

According to another example embodiment, an integrated circuit (IC) includes a plurality of circuit blocks having at least one logic circuit block and at least one non-volatile logic circuit, a power sensor configured to generate a sense signal if power supplied to at least one of the circuit blocks drops below a value, and a controller configured to generate a read enable signal or a write enable signal based on at least one of the sense signal and an externally provided command. The at least one non-volatile logic circuit includes a latch unit having a pair of latch nodes and a pair of non-volatile memory cells configured to receive first and second write voltages based on data of the pair of latch nodes and a write enable signal. The first and second write voltages are different from each other and logic values of data written to the respective non-volatile memory cells are different.

According to another example embodiment, a method of operating an integrated circuit (IC) including a plurality of circuit blocks having at least one logic circuit block and at least one non-volatile logic circuit, wherein the non-volatile logic circuit includes a latch unit having a pair of latch nodes and includes a pair of non-volatile memory cells, the method includes first generating, by the IC, a sense signal if power supplied to at least one of the circuit blocks drops below a value, second generating, by the IC, a read enable signal or a write enable signal based on at least one of the sense signal and an externally provided command, and writing, by the IC, the pair of non-volatile memory cells by applying the first and second write voltages, which are different, to the pair of non-volatile memory cells, respectively, based on data of the pair of latch nodes.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
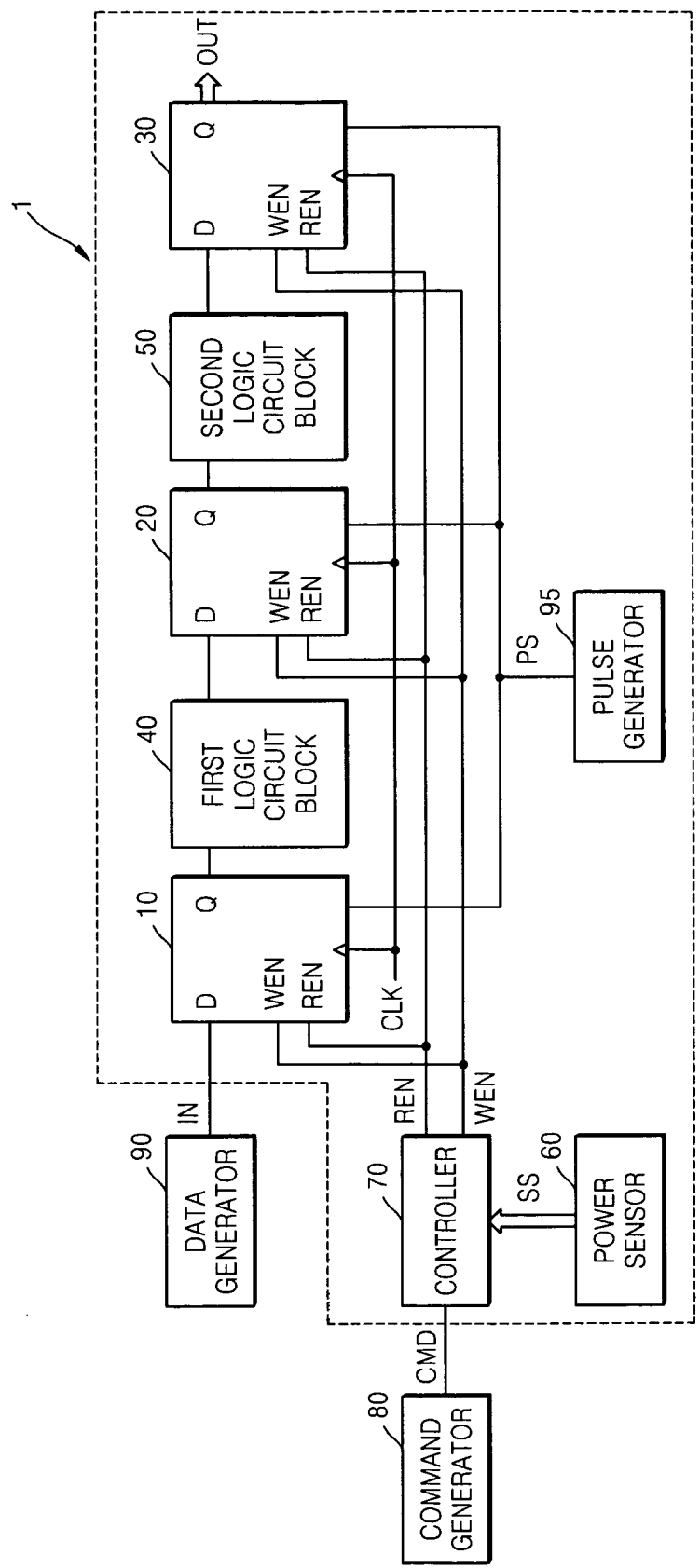
FIG. 1 is a schematic block diagram of an integrated circuit (IC) according to an example embodiment.

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of elements may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram of an integrated circuit (IC) 1 according to an example embodiment.

Referring to FIG. 1, the IC 1 may be embodied as a single chip within a single electronic system, and may include a plurality of circuit blocks 10 through 50, a power sensor 60, a controller 70 and/or a pulse generator 95 configured to output a pulse signal PS to at least circuit blocks 10, 20 and 30. Here, the plurality of circuit blocks 10 through 50 may include first through third flip-flops 10, 20, and 30 and first and second logic circuit blocks 40 and 50. Although FIG. 1 shows three flip-flops 10, 20, and 30 and two logic circuit blocks 40 and 50 for convenience of explanation, the IC 1 may include more flip-flops and/or more logic circuit blocks.

According to an example embodiment, the first through third flip-flops 10, 20, and 30 may be non-volatile flip-flops, each of which includes a pair of non-volatile memory cells. Hereinafter, non-volatile flip-flops will be described in detail as an example of a non-volatile logic circuit.

The first flip-flop 10 may receive, from an external data generator 90, externally provided input data IN and latch the input data IN to be synchronized with a clock signal CLK. The first logic circuit block 40 may perform a predetermined logic operation with respect to data output by the first flip-flop 10. The second flip-flop 20 may receive data output by the first logic circuit block 40 and latch the received data to be synchronized with a clock signal CLK. The second logic circuit block 50 may perform a predetermined logic operation with respect to data output by the second flip-flop 20. The third flip-flop 30 may receive data output by the second logic circuit block 50 and latch the received data to be synchronized with a clock signal CLK. Accordingly, the first through third flip-flops 10, 20, and 30 perform normal latching operations, such that signals within the IC 1 are synchronized with a clock signal CLK.

Furthermore, the first through third flip-flops 10, 20, and 30 may perform a write operation or a read operation with respect to the pairs of non-volatile memory cells included therein according to a write enable signal WEN or a read enable signal REN. Therefore, each of the flip-flops 10, 20, and 30 may perform the write operation or the read operation when the write enable signal WEN or the read enable signal REN is activated, and may perform a normal latching operation when the write enable signal WEN or the read enable signal REN is not activated. Detailed descriptions of operations of each of the flip-flops 10, 20, and 30 will be given below.

The power sensor 60 may sense power applied to the IC 1, and, when the power drops below a predetermined critical value, the power sensor 60 may generate a sense signal SS. In detail, the power sensor 60 may generate the sense signal SS by detecting power applied to at least one of the plurality of circuit blocks 10 through 50 in the IC 1.

The controller 70 may activate the read enable signal REN or the write enable signal WEN based on an externally input command CMD received from an external command generator 80 or the sense signal SS generated by the power sensor 60. The externally input command CMD may be a write command W_CMD or a read command R_CMD, for example. For example, to update a boot code, a user may generate the write command W_CMD. At this point, the controller 70 may activate a write enable signal WEN according to the write command W_CMD. Furthermore, in the case where a booting operation is performed or power supplied to the IC 1 is turned on, a user may generate the read command R_CMD. At this point, the controller 70 may activate the read enable signal REN according to the read command R_CMD.

Figure 2:
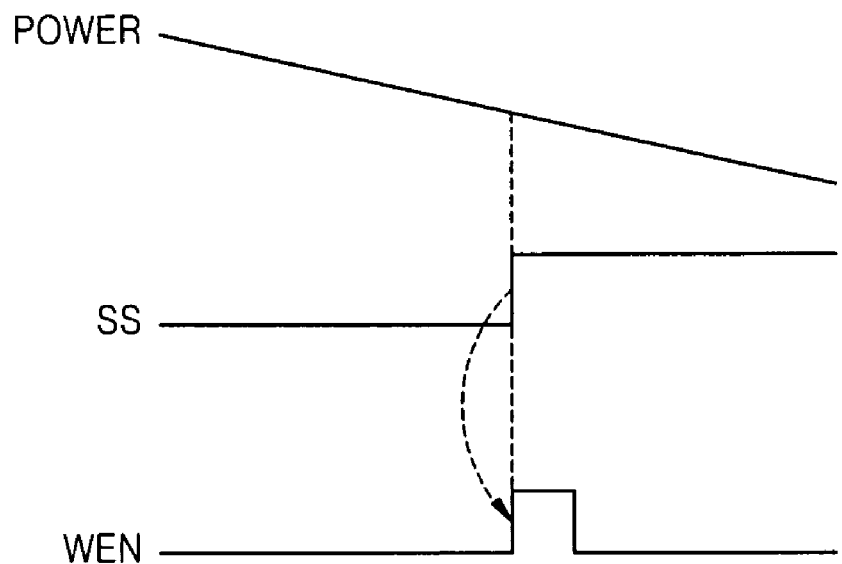
FIG. 2 is a timing diagram for describing operations of a power sensor and a controller of FIG. 1.

FIG. 2 is a timing diagram for describing operations of the power sensor 60 and the controller 70 of FIG. 1.

Referring to FIGS. 1 and 2, the power sensor 60 may generate a sense signal SS when power applied to the IC 1 drops below a predetermined critical value, and the controller 70 may activate a write enable signal WEN when a sense signal SS is generated. Here, the write enable signal WEN activated by the controller 70 may be provided to the first through third flip-flops 10, 20, and 30. Each of the flip-flops 10, 20, and 30 may perform a write operation with respect to the pair of non-volatile memory cells included in each of the flip-flops 10, 20, and 30 based on the activated write enable signal WEN.

Figure 3:
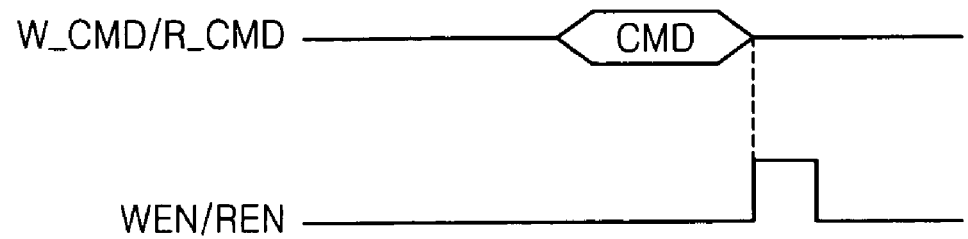
FIG. 3 is a timing diagram for describing operations of the controller of FIG. 1.

FIG. 3 is a timing diagram for describing operations of the controller 70 of FIG. 1.

Referring to FIGS. 1 and 3, when a write command W_CMD or a read command R_CMD is externally input, the controller 70 may activate a write enable signal WEN or a read enable signal REN. At this point, the write enable signal WEN and the read enable signal REN may be provided to the first through third flip-flops 10, 20, and 30. Each of the flip-flops 10, 20, and 30 may perform a read operation with respect to the pair of non-volatile memory cells included in each of the flip-flops 10, 20, and 30 based on the activated read enable signal REN. Furthermore, each of the flip-flops 10, 20, and 30 may perform a write operation with respect to the pair of non-volatile memory cells included in each of the flip-flops 10, 20, and 30 based on the activated write enable signal WEN.

Hereinafter, referring back to FIG. 1, operations of each of the flip-flops 10, 20, and 30 based on a write enable signal WEN and a read enable signal REN will be described in detail.

When the value of power supplied to the IC 1 is maintained at a constant level or an additional command is not externally received, the controller 70 may not activate the write enable signal WEN and the read enable signal REN, and thus each of the flip-flops 10, 20, and 30 may operate as a normal latch. Meanwhile, when a read command R_CMD is externally received, the controller 70 may activate the read enable signal REN, and each of the flip-flops 10, 20, and 30 may perform a read operation with respect to the pair of non-volatile memory cells included in each of the flip-flops 10, 20, and 30 based on the activated read enable signal REN. Meanwhile, when power supplied to the IC 1 drops below a predetermined critical value or a write command W_CMD is externally received, the controller 70 may activate the write enable signal WEN, and each of the flip-flops 10, 20, and 30 may perform a write operation with respect to the pair of non-volatile memory cells included in each of the flip-flops 10, 20, and 30 based on the activated write enable signal WEN.

Therefore, when the supply of the power to the IC 1 is discontinued, the power sensor 60 may generate the sense signal SS before the supply of the power is discontinued, and the controller 70 may activate the write enable signal WEN. Therefore, write operations may be performed with respect to the pairs of non-volatile memory cells included in each of the flip-flops 10, 20, and 30. As a result, the operation results of the logic circuit blocks 40 and 50 included in the IC 1 may be stored in each of the flip-flops 10, 20, and 30 before the supply of the power is discontinued.

Furthermore, when power is applied to the IC 1 again, the controller 70 may activate a read enable signal REN. Therefore, read operations may be performed with respect to data stored in the pairs of non-volatile memory cells included in each of the flip-flops 10, 20, and 30, and thus boot codes may be loaded. As a result, when power is applied to the IC 1 again, a booting operation may be performed by loading data stored in the pairs of non-volatile memory cells included in each of the flip-flops 10, 20, and 30 in the IC 1 without accessing an external read-only memory (ROM), and thus the time taken to perform a booting operation may be reduced.

When non-volatile memory cells are applied to a logic circuit, such as a flip-flop, it is necessary for the non-volatile memory cells to have excellent endurance. In other words, it is necessary for non-volatile memory cells to endure the infinite number of times write operations are performed. However, in reality, non-volatile memory cells may endure from about $10^5$ to about $10^6$ write operations. Therefore, in the case where a logic circuit includes a non-volatile memory cell, when write operations are always performed with respect to the non-volatile memory cell based on data input to the logic circuit, reliability of the logic circuit itself may not be guaranteed due to the limited endurance of the non-volatile memory cell.

According to the present example embodiment, each of the flip-flops 10, 20, and 30 may perform a write operation with respect to the pair of non-volatile memory cells included in each of the flip-flops 10, 20, and 30 only when a write enable signal WEN is received and is activated. Therefore, despite of the limited endurances of each of the non-volatile memory cells, reliability of the flip-flops 10, 20, and 30 including the non-volatile memory cells may be significantly improved by reducing the number of times write operations are performed with respect to each of the non-volatile memory cells.

Figure 4:
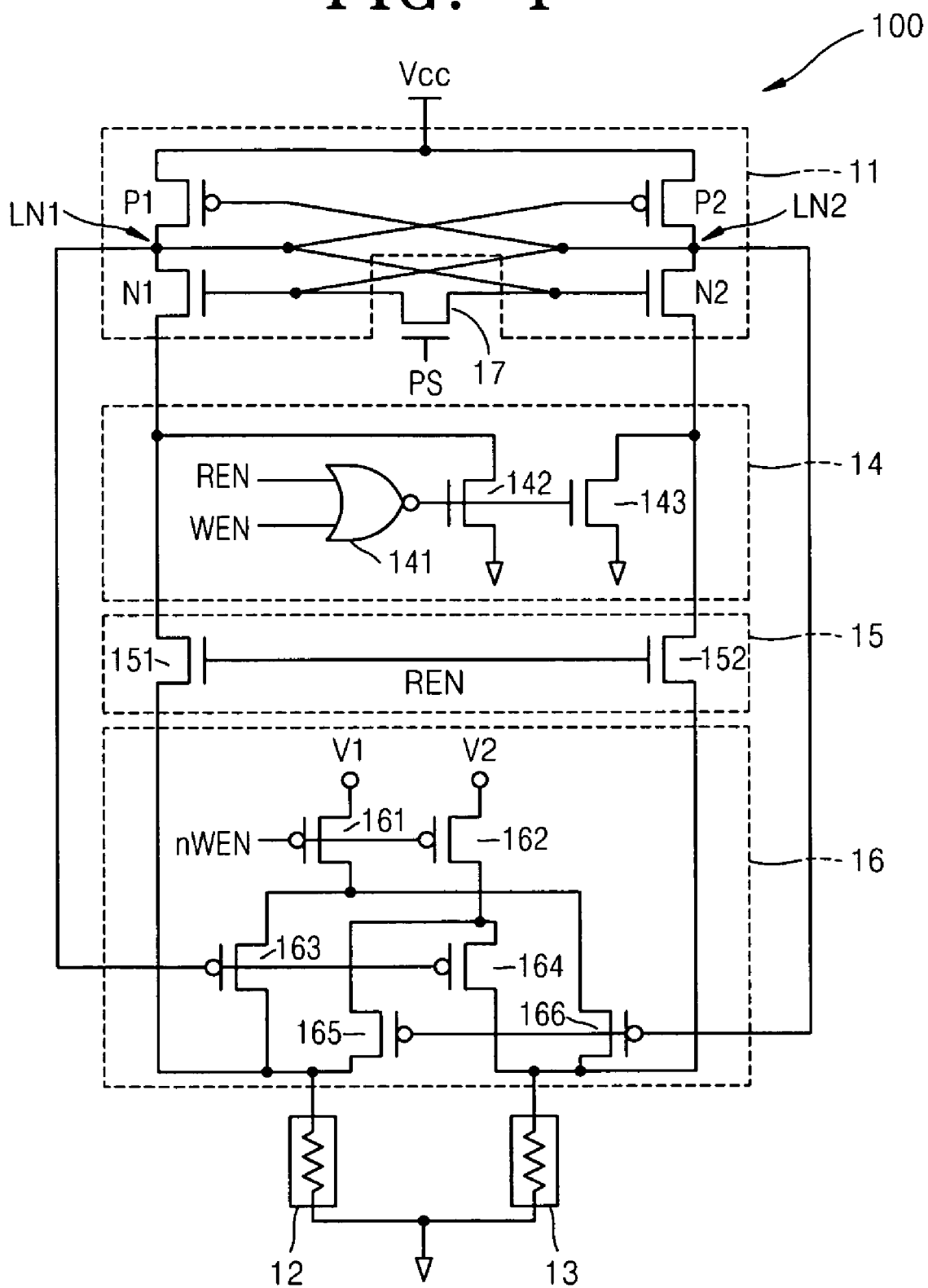
FIG. 4 is a circuit diagram showing an example of a latch circuit included in a flip-flop as shown in FIG. 1.

FIG. 4 is a circuit diagram showing an example of a latch circuit 100 included in a flip-flop as shown in FIG. 1.

Referring to FIG. 4, the latch circuit 100 includes a latch unit 11, first and second non-volatile memory cells 12 and 13, a normal operation selecting unit 14, a read operation selecting unit 15, a write operation selecting unit 16, and an equalization unit 17.

The latch unit 11 includes first and second latch nodes LN1 and LN2 and two inverters that are cross-combined to each other. A first inverter includes a first p-type metal-oxide-semiconductor (PMOS) transistor P1, which is connected to a power voltage terminal Vcc, and a first n-type metal-oxide-semiconductor (NMOS) transistor N1, which is connected to the first PMOS transistor P1 in series, whereas a second inverter includes a second PMOS transistor P2, which is connected to the power voltage terminal Vcc, and a second NMOS transistor N2, which is connected to the second PMOS transistor P2 in series. The input terminal of the first inverter and the output terminal of the second inverter correspond to the first latch node LN1, whereas the output terminal of the first inverter and the input terminal of the second inverter correspond to the second latch node LN2.

The first and second non-volatile memory cells 12 and 13 are devices capable of retaining stored data even if power supplies thereto are interrupted. For example, the first and second memory cells 12 and 13 may be resistive memory devices. The resistance values of the resistive memory devices may change according to a magnitude of a voltage or a current applied thereto and a direction in which a voltage or a current is applied thereto, thus, the resistive memory devices may have a reset state (a high resistance state) or a set state (a low resistance state). That is, the state of each of resistive memory devices changes to a high or low resistance state when a voltage or a current pulse is applied thereto. Thus, resistive memory devices may store information by using the high and low resistance states as bit information. However, the first and second non-volatile memory cells 12 and 13 are not limited to resistive memory devices, and may be any of various types of memories; e.g. flash memories, phase change memories (PRAMs), ferroelectric RAMs (FeRAMs), or magnetoresistive RAMs (MRAMs).

When the read enable signal REN and the write enable signal WEN are not activated, the normal operation selecting unit 14 controls the first and second non-volatile memory cells 12 and 13 to be not connected to the latch unit 11. In detail, the normal operation selecting unit 14 may include a logic gate 141 and first and second ground switches 142 and 143 that are turned on/off by an output signal of the logic gate 141.

The logic gate 141 activates an output signal in the case where the read enable signal REN and the write enable signal WEN are not activated. For example, the logic gate 141 may be embodied as a NOR gate, and may perform a logic NOR operation with respect to a read enable signal REN and a write enable signal WEN. When an output signal of the logic gate 141 is activated, the first and second ground switches 142 and 143 are closed and respectively connect the source terminals of the first and second NMOS transistors N1 and N2 included in the latch unit 11 to ground voltage terminals. Accordingly, when the read enable signal REN and the write enable signal WEN are not activated, the latch circuit 100 may operate as a normal latch.

When a read enable signal REN is activated, the read operation selecting unit 15 provides data stored in the first and second non-volatile memory cells 12 and 13 to the first and second latch nodes LN1 and LN2 by connecting the first and second non-volatile memory cells 12 and 13 to the first and second latch nodes LN1 and LN2, respectively. In detail, the read operation selecting unit 15 may include first and second read switches 151 and 152 that are turned on/off by a read enable signal REN.

When a read enable signal REN is activated, the first and second read switches 151 and 152 are closed and respectively connect the first and second non-volatile memory cells 12 and 13 to the first and second latch nodes LN1 and LN2. Therefore, data stored in the first and second non-volatile memory cells 12 and 13 may be transmitted to the first and second latch nodes LN1 and LN2, and thus a read operation may be performed.

When a write enable signal WEN is activated, the write operation selecting unit 16 applies first and second write voltages V1 and V2, which differ from each other according to data of the first and second latch nodes LN1 and LN2, to the first and second non-volatile memory cells 12 and 13, respectively. Here, the first write voltage V1 may be a voltage to be applied to set the first and second non-volatile memory cells 12 and 13, and the second write voltage V2 may be a voltage to be applied to reset the first and second non-volatile memory cells 12 and 13. The second write voltage V2 may be greater than the first write voltage V1. In detail, the write operation selecting unit 16 includes first and second write voltage providing units 161 and 162, first write switches 163 and 164, and second write switches 165 and 166.

The first write voltage providing unit 161 may include a PMOS transistor having a source connected to a first write voltage V1 terminal and having a gate, to which an inverted write enable signal nWEN is applied. The second write voltage providing unit 162 may include a PMOS transistor having a source connected to a second write voltage V2 terminal and having a gate, to which the inverted write enable signal nWEN is applied. Therefore, when the write enable signal WEN is activated (that is, when the inverted write enable signal nWEN is logic low), the PMOS transistors included in the first and second write voltage providing units 161 and 162 may be turned on and may respectively output first and second write voltages V1 and V2.

The first write switches 163 and 164 are turned on/off by data of the first latch node LN1 and connect the output terminals of the first and second write voltage providing units 161 and 162 to the first and second non-volatile memory cells 12 and 13, respectively. The second write switches 165 and 166 are turned on/off by data of the second latch node LN2 and connect the output terminals of the first and second write voltage providing units 161 and 162 to the first and second non-volatile memory cells 12 and 13, respectively.

The equalization unit 17 is interconnected between the first latch node LN1 and the second latch node LN2, and, when a pulse signal PS having a pulse width is applied thereto, the equalization unit 17 transmits voltages of the first latch node LN1 and the second latch node LN2. In detail, the equalization unit 17 may be embodied as an NMOS transistor having a gate to which a pulse signal PS is applied. Therefore, when the pulse signal PS is activated (logic high), the first latch node LN1 and the second latch node LN2 are connected to each other, and thus the voltage of the first latch node LN1 becomes equal to the voltage of the second latch node LN2.

Here, the pulse signal PS is activated when a read operation is performed with respect to the first and second non-volatile memory cells 12 and 13. Therefore, when the pulse signal PS is deactivated after the voltages of the first latch node LN1 and the second latch node LN2 are equalized during a period when the pulse signal PS is activated, data stored in the first and second non-volatile memory cells 12 and 13 may be read out by transmitting the data stored in the first and second non-volatile memory cells 12 and 13 to the first latch node LN1 and the second latch node LN2.

Figure 5:
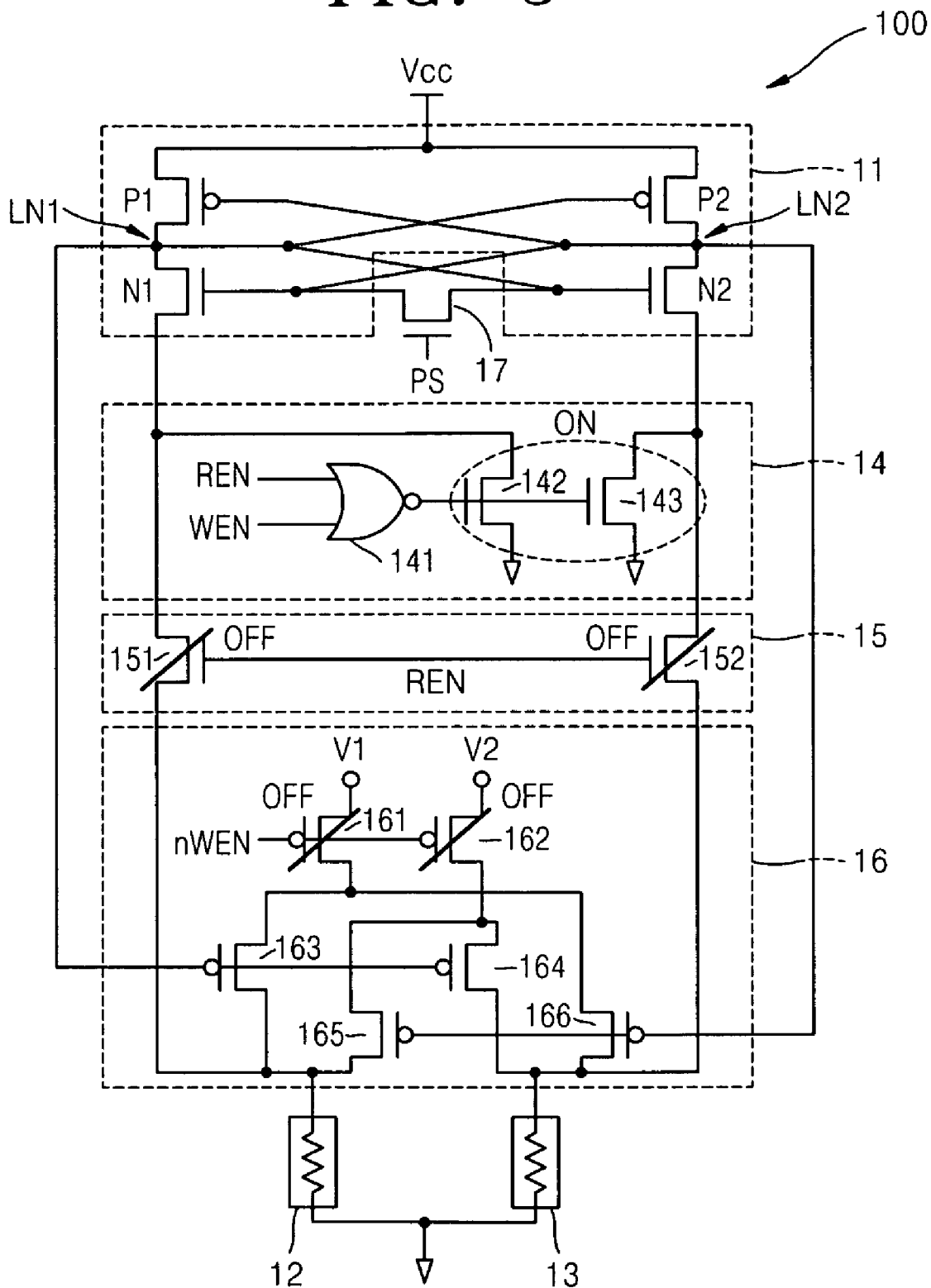
FIG. 5 is a circuit diagram for describing a normal operation of the latch circuit shown in FIG. 4.

FIG. 5 is a circuit diagram for describing a normal operation of the latch circuit 100 shown in FIG. 4.

Referring to FIG. 5, when the latch circuit 100 performs normal operations, a read enable signal REN and a write enable signal WEN are not activated, and a pulse signal PS is also not activated. Therefore, an output signal of the logic gate 141 of the normal operation selecting unit 14 is activated, and thus the first and second ground switches 142 and 143 are closed ("on"). Meanwhile, the first and second read switches 151 and 152 are opened ("off"), and the first and second write voltage providing units 161 and 162 of the write operation selecting unit 16 and the equalization unit 17 are deactivated. Therefore, the latch unit 11 is not connected to the first and second non-volatile memory cells 12 and 13, and thus the latch circuit 100 operates as a normal latch circuit.

Figure 6:
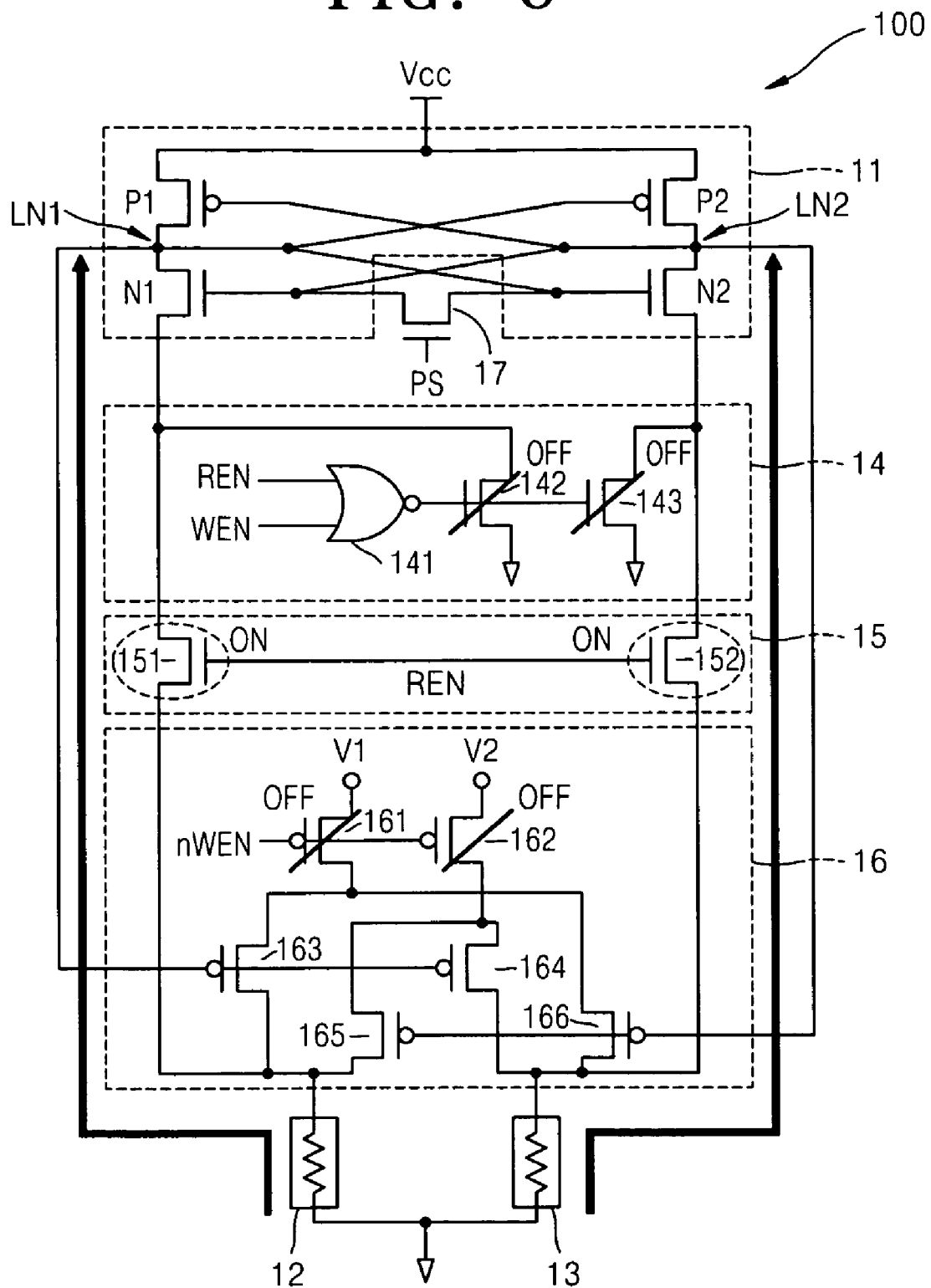
FIG. 6 is a circuit diagram for describing a read operation of the latch circuit shown in FIG. 4.

FIG. 6 is a circuit diagram for describing a read operation of the latch circuit 100 shown in FIG. 4.

Referring to FIG. 6, in the case where the latch circuit 100 performs the read operation, a read enable signal REN and a pulse signal PS are activated, whereas a write enable signal WEN is not activated. Here, a period when a pulse signal PS is activated is shorter than a period when a read enable signal REN is activated. Therefore, the equalization unit 17 connects the first latch node LN1 and the second latch node LN2 first, and thus the voltages of the first latch node LN1 and the second latch node LN2 are equalized.

Furthermore, an output signal of the logic gate 141 of the normal operation selecting unit 14 is not activated, and thus the first and second ground switches 142 and 143 are opened. Meanwhile, the first and second read switches 151 and 152 of the read operation selecting unit 15 are closed, and the first and second write voltage providing units 161 and 162 of the write operation selecting unit 16 are deactivated. Therefore, the first and second non-volatile memory cells 12 and 13 are connected to the first and second latch nodes LN1 and LN2 via the path indicated by an arrow in FIG. 6, and thus data stored in the first and second non-volatile memory cells 12 and 13 are transmitted to the first and second latch nodes LN1 and LN2, respectively.

Figure 7:
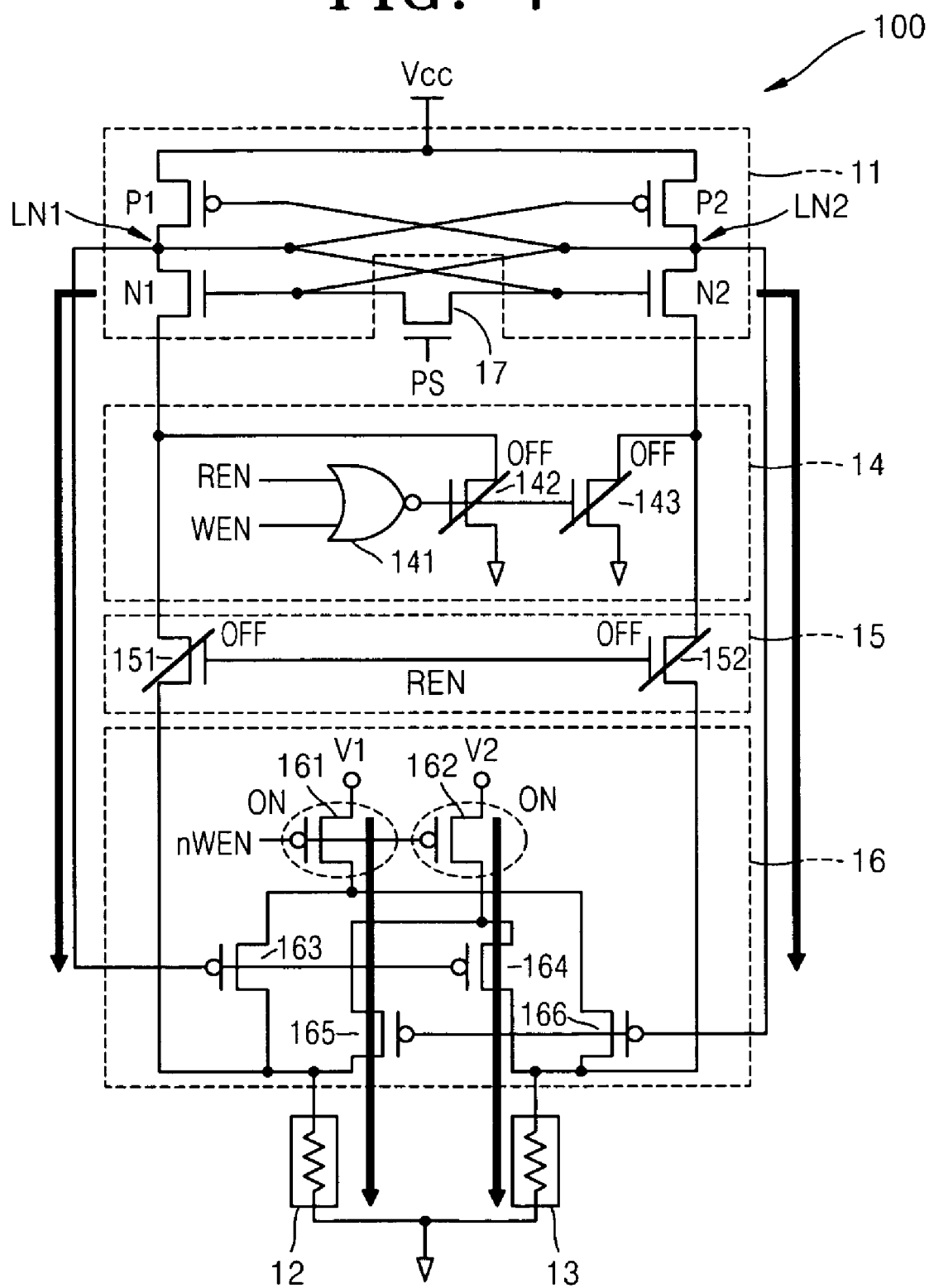
FIG. 7 is a circuit diagram for describing a write operation of the latch circuit shown in FIG. 4.

FIG. 7 is a circuit diagram for describing a write operation of the latch circuit 100 shown in FIG. 4.

Referring to FIG. 7, in the case where the latch circuit 100 performs the write operation, a write enable signal WEN is activated, whereas a read enable signal REN and a pulse signal PS are not activated. Therefore, an output signal of the logic gate 141 of the normal operation selecting unit 14 is not activated, and thus the first and second ground switches 142 and 143 are opened. Meanwhile, the first and second read switches 151 and 152 of the read operation selecting unit 15 are opened, and the first and second write voltage providing units 161 and 162 of the write operation selecting unit 16 are activated.

Therefore, data of the first and second latch nodes LN1 and LN2 are provided to the first write switches 163 and 164 and the second write switches 165 and 166 via the path indicated by an arrow in FIG. 7. Here, data of the first latch node LN1 and data of the second latch node LN2 have opposite logic values, and thus the first write switches 163 and 164 or the second write switches 165 and 166 are selectively opened.

In detail, when the data of the first latch node LN1 is logic high and the data of the second latch node LN2 is logic low, the first write switches 163 and 164 are opened, and the second write switches 165 and 166 are closed. Therefore, the output terminal of the second write voltage providing unit 162 is connected to the first non-volatile memory cell 12, whereas the output terminal of the first write voltage providing unit 161 is connected to the second non-volatile memory cell 13. Therefore, a second write voltage V2, which is a reset voltage, is applied to the first non-volatile memory cell 12, and a first write voltage V1, which is a set voltage, is applied to the second non-volatile memory cell 13.

Meanwhile, when the data of the first latch node LN1 is logic low and the data of the second latch node LN2 is logic high, the first write switches 163 and 164 are closed, and the second write switches 165 and 166 are opened. Therefore, the output terminal of the first write voltage providing unit 161 is connected to the first non-volatile memory cell 12, whereas the output terminal of the second write voltage providing unit 162 is connected to the second non-volatile memory cell 13. Therefore, a first write voltage V1, which is a set voltage, is applied to the first non-volatile memory cell 12, and a second write voltage V1, which is a reset voltage, is applied to the second non-volatile memory cell 13.

Figure 8:
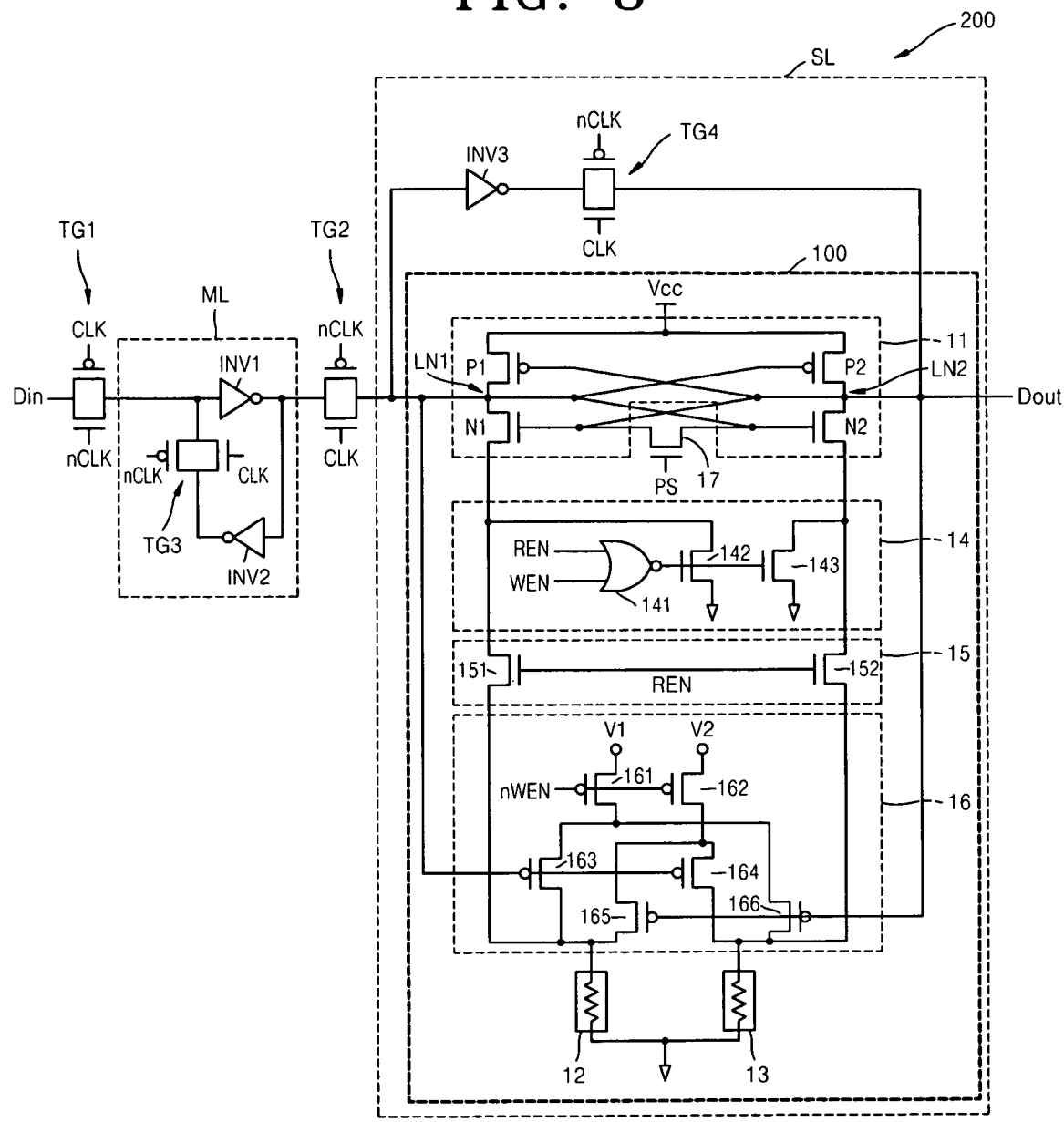
FIG. 8 is a circuit diagram showing an example of a flip-flop shown in FIG. 1.

FIG. 8 is a circuit diagram showing an example of a flip-flop 200 as shown in FIG. 1. The first through third flip-flops 10, 20 and 30 have the same structure of the flip-flop 200, shown in FIG. 8.

Referring to FIG. 8, the flip-flop 200 may be a master-slave flip-flop including a master latch ML and a slave latch SL. The flip-flop 200 may further include first and second transmission gates TG1 and TG2. The first transmission gate TG1 is turned on/off by a clock signal CLK and an inverted clock signal nCLK and may transmit input data Din to the master latch ML. The second transmission gate TG2 is turned on/off by the clock signal CLK and the inverted clock signal nCLK and may transmit output data of the master latch ML to the slave latch SL.

The master latch ML includes first and second inverters INV1 and INV2 that are cross-coupled with each other, and may further include a third transmission gate TG3. The third transmission gate TG3 may be turned on/off by the clock signal CLK and the inverted clock signal nCLK and may transmit output data of the second inverter INV2 to the first inverter INV1.

The slave latch SL may include the latch circuit 100 of FIG. 4. Therefore, the latch circuit 100 included in the slave latch SL is identical to the latch circuit 100 shown in FIG. 4, and thus detailed descriptions thereof will be omitted. Furthermore, the slave latch SL may further include a third inverter INV3 and a fourth transmission gate TG4. The third inverter INV3 inverts output data of the second transmission gate TG2. The fourth transmission gate TG4 may be turned on/off by the clock signal CLK and the inverted clock signal nCLK, and may transmit output data of the third inverter INV3 to an output node Dout. According to another example embodiment, the third inverter INV3 may be connected to the output terminal of the master latch ML and may invert output data of the master latch ML.

Figure 9:
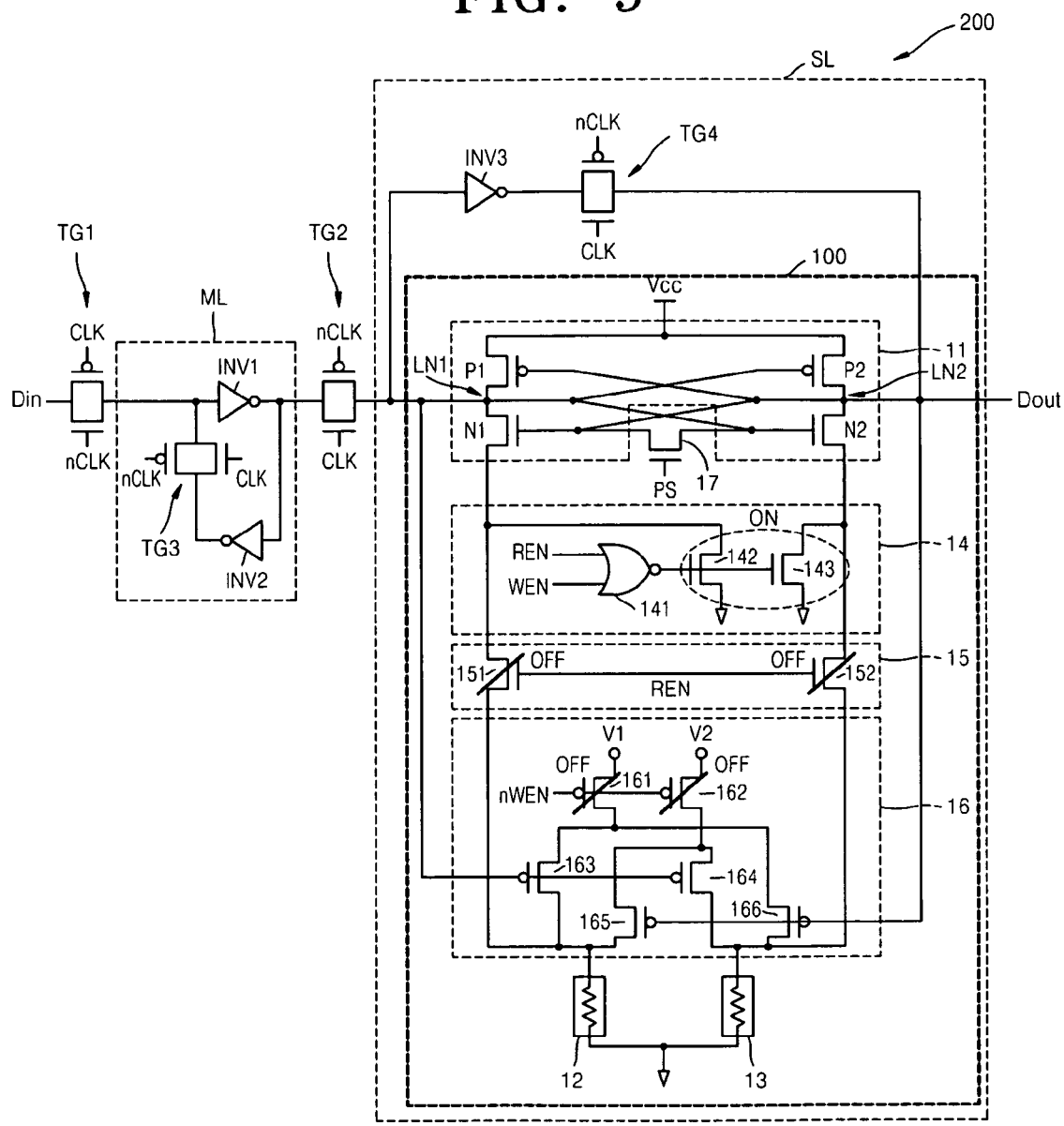
FIG. 9 is a circuit diagram for describing a normal operation of the flip-flop of FIG. 8.

FIG. 9 is a circuit diagram for describing a normal operation of the flip-flop 200 of FIG. 8.

Referring to FIG. 9, in the case where the flip-flop 200 performs the normal operation, a read enable signal REN and a write enable signal WEN are not activated, and a pulse signal is also not activated. Therefore, an output signal of the logic gate 141 of the normal operation selecting unit 14 is activated, and thus the first and second ground switches 142 and 143 are closed. Meanwhile, the first and second read switches 151 and 152 are opened, and the first and second write voltage providing units 161 and 162 of the write operation selecting unit 16 and the equalization unit 17 are deactivated. Therefore, the latch unit 11 is not connected to the first and second non-volatile memory cells 12 and 13, and thus the latch circuit 100 operates as a normal latch circuit. Therefore, the flip-flop 200 functions as a normal master slave flip-flop. Here, the flip-flop 200 may latch data at the rising edge of a clock signal CLK.

Figure 10:
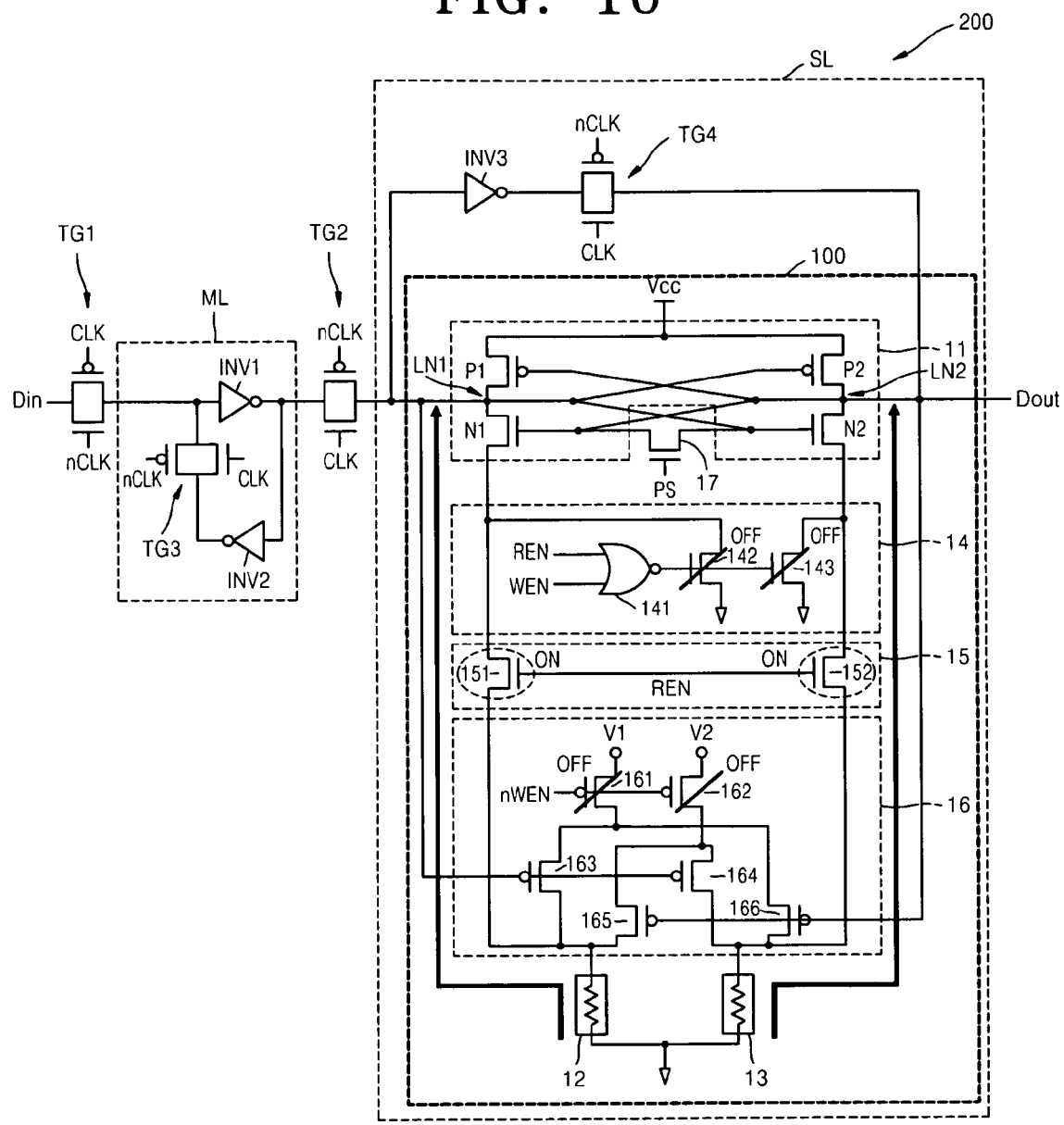
FIG. 10 is a circuit diagram for describing a read operation of the flip-flop of FIG. 8.

FIG. 10 is a circuit diagram for describing a read operation of the flip-flop 200 of FIG. 8.

Referring to FIG. 10, in the case where the flip-flop 200 performs the read operation, a read enable signal REN and a pulse signal PS are activated, whereas a write enable signal WEN is not activated. Here, a period when the pulse signal PS is activated is shorter than a period when the read enable signal REN is activated. Therefore, the equalization unit 17 connects the first latch node LN1 and the second latch node LN2 first, and thus the voltages of the first latch node LN1 and the second latch node LN2 are equalized. Next, when the pulse signal PS is deactivated, the voltages of the first latch node LN1 and the second latch node LN2 are changed by the read operation with respect to the first and second non-volatile memory cells 12 and 13.

Here, an output signal of the logic gate 141 of the normal operation selecting unit 14 is not activated, and thus the first and second ground switches 142 and 143 are opened. Meanwhile, the first and second read switches 151 and 152 of the read operation selecting unit 15 are closed, and the first and second write voltage providing units 161 and 162 of the write operation selecting unit 16 are deactivated. Therefore, the first and second non-volatile memory cells 12 and 13 are connected to the first and second latch nodes LN1 and LN2 via the path indicated by an arrow in FIG. 10, and thus data stored in the first and second non-volatile memory cells 12 and 13 are transmitted to the first and second latch nodes LN1 and LN2, respectively.

Figure 11:
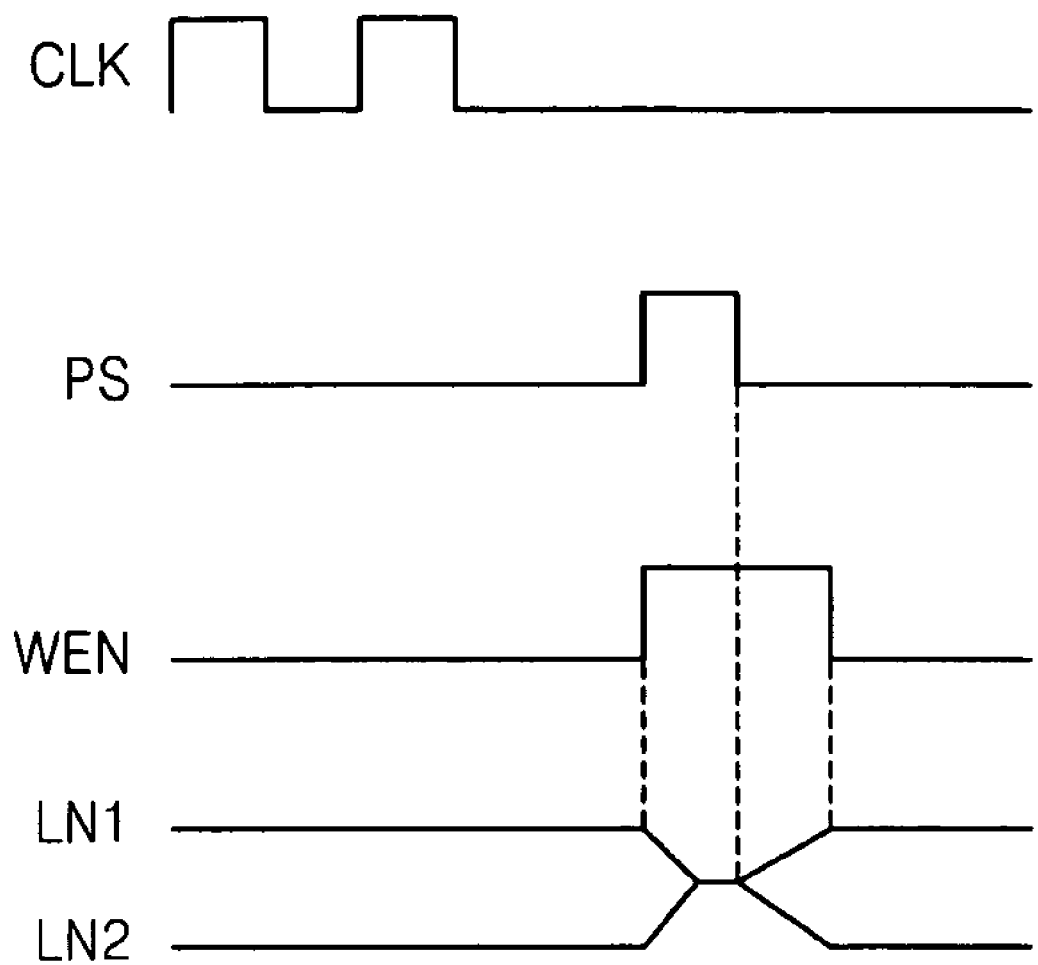
FIG. 11 is a timing diagram for describing a read operation of the flip-flop of FIG. 8.

FIG. 11 is a timing diagram for describing a read operation of the flip-flop 200 of FIG. 8.

Referring to FIGS. 10 and 11, data Din input to the flip-flop 200 is transmitted to the slave latch SL after two cycles of a clock signal CLK. Next, when a pulse signal PS is activated, the first latch node LN1 and the second latch node LN2 of the slave latch SL are connected to each other, and thus the voltages of the first and second latch nodes LN1 and LN2 are equalized. When the voltages of the first and second latch nodes LN1 and LN2 are equalized, the pulse signal PS is deactivated. In the case of performing the read operation, it is necessary to perform the equalization of the voltages of the first and second latch nodes LN1 and LN2 first for clearly sensing data of the first and second non-volatile memory cells 12 and 13.

Furthermore, when a read enable signal REN is activated, the first and second non-volatile memory cells 12 and 13 are connected to the first and second latch nodes LN1 and LN2, respectively. Therefore, data stored in the first and second non-volatile memory cells 12 and 13 is transmitted to the first and second latch nodes LN1 and LN2, respectively. Accordingly, the read operation is performed with respect to the first and second non-volatile memory cells 12 and 13.

Figure 12:
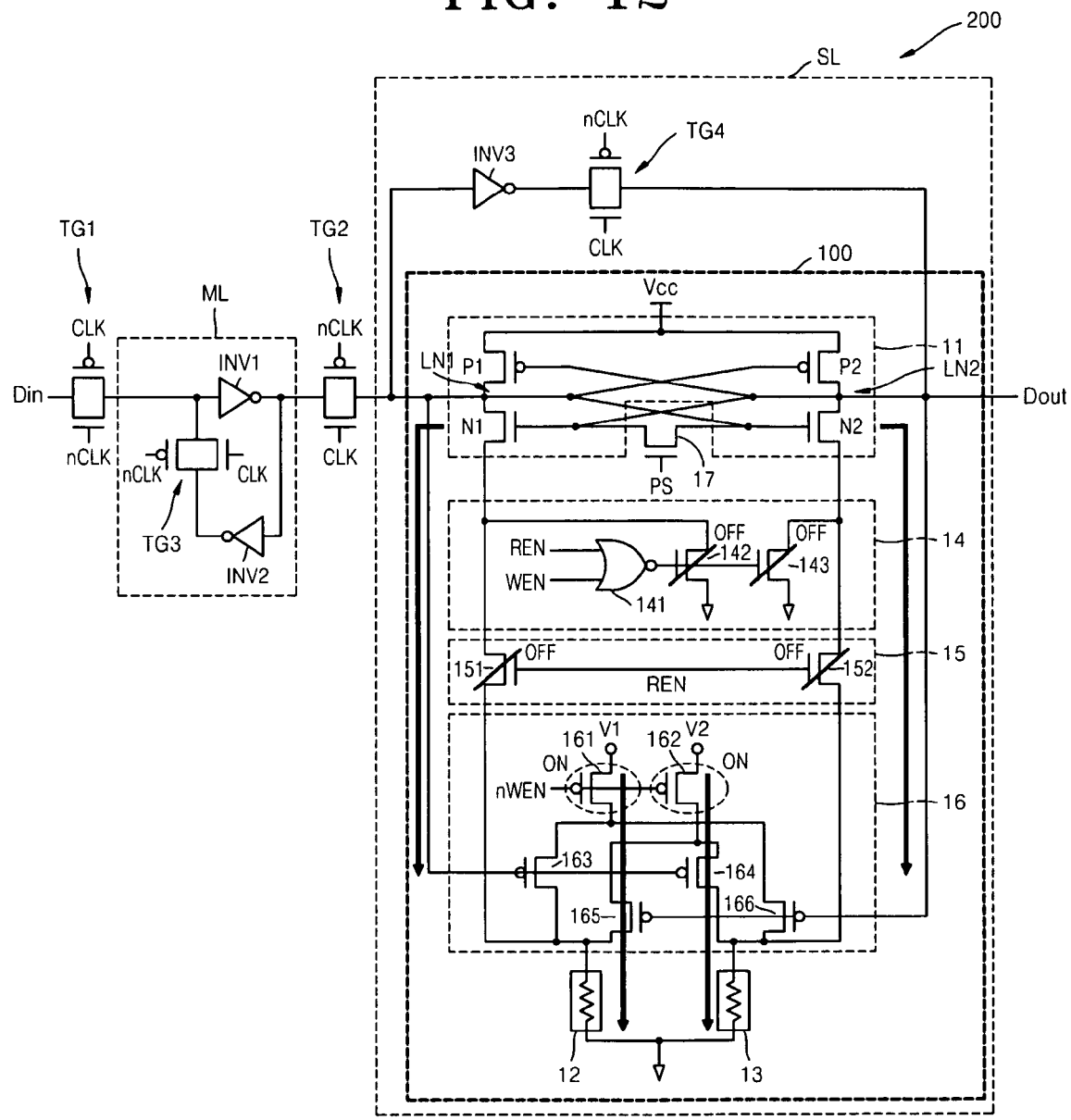
FIG. 12 is a circuit diagram for describing a write operation of the flip-flop shown in FIG. 8.

FIG. 12 is a circuit diagram for describing a write operation of the flip-flop 200 shown in FIG. 8.

Referring to FIG. 12, in the case where the flip-flop 200 performs the write operation, a write enable signal WEN is activated, whereas a read enable signal REN and a pulse signal PS are not activated. Therefore, an output signal of the logic gate 141 of the normal operation selecting unit 14 is not activated, and thus the first and second ground switches 142 and 143 are opened. Meanwhile, the first and second read switches 151 and 152 of the read operation selecting unit 15 are opened, and the first and second write voltage providing units 161 and 162 of the write operation selecting unit 16 are activated.

Therefore, data of the first and second latch nodes LN1 and LN2 are connected to the first write switches 163 and 164 and the second write switches 165 and 166 via the path indicated by an arrow in FIG. 12. Here, data of the first latch node LN1 and data of the second latch node LN2 have opposite logic values, and thus the first write switches 163 and 164 or the second write switches 165 and 166 are selectively opened.

Figure 13:
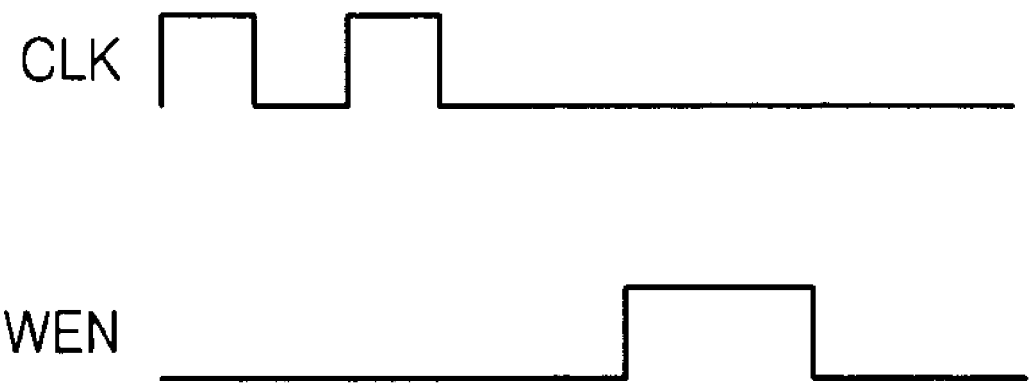
FIG. 13 is a timing diagram for describing write operation of the flip-flop shown in FIG. 8.

FIG. 13 is a timing diagram for describing a write operation of the flip-flop 200 shown in FIG. 8.

Referring to FIGS. 12 and 13, data Din input to the flip-flop 200 is transmitted to the slave latch SL after two cycles of a clock signal CLK. Next, when a read enable signal WEN is activated, the first latch node LN1 and the second latch node LN2 of the slave latch SL are connected to the first write switches 163 and 164 and the second write switches 165 and 166, respectively. Therefore, the first write switches 163 and 164 and the second write switches 165 and 166 are turned on/off by data of the first and second latch nodes LN1 and LN2, and the first and second write voltages V1 and V2 are selectively applied to the first and second non-volatile memory cells 12 and 13. Accordingly, the write operation is performed with respect to the first and second non-volatile memory cells 12 and 13.

In detail, when the data of the first latch node LN1 is logic high and the data of the second latch node LN2 is logic low, the first write switches 163 and 164 are opened, and the second write switches 165 and 166 are closed. Therefore, the output terminal of the second write voltage providing unit 162 is connected to the first non-volatile memory cell 12, whereas the output terminal of the first write voltage providing unit 161 is connected to the second non-volatile memory cell 13. Therefore, a second write voltage V2, which is a reset voltage, is applied to the first non-volatile memory cell 12, and a first write voltage V1, which is a set voltage, is applied to the second non-volatile memory cell 13.

Meanwhile, when the data of the first latch node LN1 is logic low and the data of the second latch node LN2 is logic high, the first write switches 163 and 164 are closed, and the second write switches 165 and 166 are opened. Therefore, the output terminal of the first write voltage providing unit 161 is connected to the first non-volatile memory cell 12, whereas the output terminal of the second write voltage providing unit 162 is connected to the second non-volatile memory cell 13. Therefore, a first write voltage V1, which is a set voltage, is applied to the first non-volatile memory cell 12, and a second write voltage V1, which is a reset voltage, is applied to the second non-volatile memory cell 13.

An IC according to example embodiments as described above may be included in an electronic device or in an electric system. In detail, an IC according to an example embodiment may be embodied as a single chip in an electronic device or in an electric system. Accordingly, logic circuits included in a plurality of chips included in an electronic device or in an electric system may include non-volatile memory cells. Therefore, data of the electronic device or in the electric system may be stored in non-volatile memory cells even in the case where power is suddenly removed, and the electronic device or the electric system may be booted quickly after power is restored.

As described above, according to one or more of the example embodiments, a non-volatile logic circuit includes a latch unit, which includes a pair of latch nodes, and a pair of non-volatile memory cells, and performs a write operation with respect to the pair of non-volatile memory cells only when a write enable signal is activated. Therefore, a non-volatile logic circuit may be stably operated despite the limited endurance of non-volatile memory cells.

Furthermore, according to the one or more of example embodiments, the non-volatile logic circuit transmits data stored in the non-volatile memory cells to the pair of latch nodes, respectively, when a read enable signal is activated. Thus, the data stored in the non-volatile memory cells before power is cut off may be quickly read from when power is supplied again. Accordingly, the non-volatile logic circuit may be booted in a simple manner and directly without having to access an external ROM, thereby greatly reducing a booting time.

Furthermore, according to the one or more example embodiments, even if power is cut off suddenly, data stored in the non-volatile logic circuit may be written to the non-volatile memory cells by generating a sense signal and activating a write enable signal and the data may be read from the non-volatile memory cells when power is supplied again.

It should be understood that example embodiments described herein should be considered in a descriptive sense only and not for purposes of limitation. Descriptions of features or aspects within example embodiments should typically be considered as available for other similar features or aspects in other example embodiments. It will be understood that various changes in form and details may be made therein without departing from the spirit and scope of the following claims.

What is claimed is:

1. A non-volatile logic circuit comprising:
a latch unit having a pair of latch nodes; and
a pair of non-volatile memory cells configured to receive first and second write voltages based on data of the pair of latch nodes and a write enable signal, wherein
the first and second write voltages are different and logic values of data written to each of the pair of non-volatile memory cells is different.

2. The non-volatile logic circuit of claim 1, wherein the pair of latch nodes are configured to receive data stored in the pair of non-volatile memory cells based on a read enable signal.

3. The non-volatile logic circuit of claim 2, wherein a read operation selecting unit is configured to disconnect the pair of non-volatile memory cells and the pair of latch nodes based on the read enable signal.

4. The non-volatile logic circuit of claim 1, further comprising:
a normal operation selecting unit configured to control a connection between the pair of non-volatile memory cells and the pair of latch nodes based on a read enable signal and the write enable signal;
a read operation selecting unit configured to provide data stored in the pair of non-volatile memory cells to the pair of latch nodes based on the read enable signal; and
a write operation selecting unit configured to apply the first and second write voltages to the pair of non-volatile memory cells, respectively, based on data of the pair of latch nodes and the write enable signal.

5. The non-volatile logic circuit of claim 4, further comprising:
an equalization unit configured to connect the pair of latch nodes based on a pulse signal for equalizing the data of the pair of latch nodes.

6. The non-volatile logic circuit of claim 4, wherein the normal operation selecting unit comprises:
a logic gate configured to output an activated output signal based on the read enable signal and the write enable signal; and
first and second ground switches configured to connect the pair of latch nodes, respectively, to ground voltage terminals based on the activated output signal.

7. The non-volatile logic circuit of claim 4, wherein the read operation selecting unit includes first and second read switches configured to connect the pair of latch nodes to the pair of non-volatile memory cells, respectively, based on the read enable signal.

8. The non-volatile logic circuit of claim 4, wherein the write operation selecting unit comprises:
first and second write voltage providing units configured to apply the first and second write voltages, respectively, based on the write enable signal;
two first write switches configured to connect the first and second write voltage providing units to the pair of non-volatile memory cells, respectively, based on data of a first latch node of the pair of the latch nodes; and
two second write switches configured to connect the first and second write voltage providing units to the pair of non-volatile memory cells, respectively, based on data of a second latch node of the pair of the latch nodes.

9. A circuit block comprising:
a master latch configured to latch input data; and
a slave latch including the non-volatile logic circuit of claim 1, the slave latch being configured to latch output data of the master latch.

10. The circuit block of claim 9, wherein the slave latch comprises:
a normal operation selecting unit configured to control a connection between the pair of non-volatile memory cells and the pair of latch nodes based on a read enable signal and the write enable signal;
a read operation selecting unit configured to provide data stored in the pair of non-volatile memory cells to the pair of latch nodes based on the read enable signal; and
a write operation selecting unit configured to apply the first and second write voltages to the pair of non-volatile memory cells, respectively, based on data of the pair of latch nodes and the write enable signal.

11. The circuit block of claim 10, wherein the slave latch further comprises:
an equalization unit configured to connect the pair of latch nodes based on a pulse signal for equalizing the data of the pair of latch nodes.

12. The circuit block of claim 9, further comprising:
a first transmission gate configured to transmit the input data to the master latch based on a clock signal and an inverted clock signal; and
a second transmission gate configured to output data of the master latch to the slave latch based on the clock signal and the inverted clock signal.

13. The circuit block of claim 12, wherein the slave latch comprises:
an inverter connected to an output terminal of the second transmission gate; and
a third transmission gate configured to output data of the inverter to an output terminal of the slave latch based on the clock signal and the inverted clock signal.

14. The circuit block of claim 12, wherein the slave latch comprises:
an inverter connected to an output terminal of the master latch; and
a third transmission gate configured to output data of the inverter to an output terminal of the slave latch based on the clock signal and the inverted clock signal.

15. An integrated circuit (IC) comprising:
a plurality of circuit blocks having at least one logic circuit block and at least one non-volatile logic circuit according to claim 1;
a power sensor configured to generate a sense signal if power supplied to at least one of the circuit blocks drops below a value; and
a controller configured to generate a read enable signal or a write enable signal based on at least one of the sense signal and an externally provided command.

16. The IC of claim 15, wherein the at least one non-volatile logic circuit further comprises:
a normal operation selecting unit configured to control a connection between the pair of non-volatile memory cells and the pair of latch nodes based on a read enable signal and the write enable signal;
a read operation selecting unit configured to provide data stored in the pair of non-volatile memory cells to the pair of latch nodes based on the read enable signal; and a write operation selecting unit configured to apply the first and second write voltages to the pair of non-volatile memory cells, respectively, based on data of the pair of latch nodes and the write enable signal.

17. The IC of claim 16, wherein the at least one non-volatile logic circuit further comprises:
an equalization unit configured to connect the pair of latch nodes based on a pulse signal for equalizing the data of the pair of latch nodes.

18. A method of operating an integrated circuit (IC) including a plurality of circuit blocks having at least one logic circuit block and at least one non-volatile logic circuit, wherein the non-volatile logic circuit includes a latch unit having a pair of latch nodes and includes a pair of non-volatile memory cells, the method comprising:
generating, by the IC, a sense signal if power supplied to at least one of the plurality of circuit blocks drops below a value;
generating, by the IC, a read enable signal or a write enable signal based on at least one of the sense signal and an externally provided command; and
writing, by the IC, the pair of non-volatile memory cells, by applying the first and second write voltages, which are different, to the pair of non-volatile memory cells, respectively, based on data of the pair of latch nodes.

19. The method of claim 18, further comprising at least one of:
disconnecting connections between the pair of non-volatile memory cells and the pair of latch nodes if the read enable signal and write enable signal are not activated; and
providing data stored in the pair of non-volatile memory cells to the pair of latch nodes based on the read enable signal.

20. The method of claim 19, further comprising:
equalizing data of the pair of latch nodes by connecting the pair of latch nodes based on a pulse signal for equalizing the data of the pair of latch nodes.

* * * * *